US006094128A

United States Patent [19]

Bennett et al.

[11] Patent Number: 6,094,128

[45] Date of Patent: Jul. 25, 2000

[54] OVERLOAD PROTECTED SOLID STATE VARISTORS

[75] Inventors: John C. Bennett, Hampton; Ronald D. Boyd; Robert W. Stockum, both of Poquoson, all of Va.

[73] Assignee: Maida Development Company, Hampton, Va.

[21] Appl. No.: 09/132,492

[22] Filed: Aug. 11, 1998

[51] Int. Cl.[7] .......... H01L 7/10

[52] U.S. Cl. .......... 338/21; 338/20; 338/67

[58] Field of Search .......... 338/21, 20, 67; 337/4, 5, 142, 290, 183, 184

[56] References Cited

U.S. PATENT DOCUMENTS

| | | | |
|---|---|---|---|
| 3,914,657 | 10/1975 | Melanson . | |
| 3,928,245 | 12/1975 | Fishman et al. . | |
| 3,959,543 | 5/1976 | Ellis . | |
| 4,092,694 | 5/1978 | Stetson . | |
| 4,096,464 | 6/1978 | Dennis et al. . | |
| 4,211,994 | 7/1980 | Oda . | |
| 4,233,641 | 11/1980 | Baumbach . | |
| 4,249,224 | 2/1981 | Baumbach . | |
| 4,288,833 | 9/1981 | Howell . | |
| 4,436,650 | 3/1984 | Bowen . | |
| 4,506,285 | 3/1985 | Einzinger . | |
| 4,627,154 | 12/1986 | Pattison | 29/623.1 |
| 4,652,848 | 3/1987 | Hundrieser | 337/297 |
| 4,652,964 | 3/1987 | Ziegenbein | 361/54 |
| 4,700,169 | 10/1987 | Tanno . | |
| 4,739,436 | 4/1988 | Stefani et al. . | |
| 4,851,946 | 7/1989 | Igarashi et al. . | |
| 5,140,491 | 8/1992 | Allina . | |
| 5,198,791 | 3/1993 | Shibayama et al. | 337/31 |
| 5,241,445 | 8/1993 | Karasawa . | |
| 5,247,273 | 9/1993 | Shibayama et al. . | |
| 5,248,953 | 9/1993 | Hönl . | |
| 5,313,184 | 5/1994 | Greuter et al. . | |
| 5,523,916 | 6/1996 | Kaczmarek . | |
| 5,781,394 | 7/1998 | Lorenz et al. | 361/124 |

FOREIGN PATENT DOCUMENTS

| | | |
|---|---|---|
| 2-157136 | 6/1990 | Japan . |
| 4-48702 | 2/1992 | Japan . |
| 4-315402 | 11/1992 | Japan . |
| 5-13205 | 1/1993 | Japan . |
| 5-152109 | 6/1993 | Japan . |

OTHER PUBLICATIONS

"The Physics of Metals Oxide Varistors" Lionel M. Levinson and H. R. Philipp, *Journal of Applied Physics*, Mar. 1975, pp. 1332–1341.

*Primary Examiner*—Lincoln Donovan
*Assistant Examiner*—Richard K. Lee
*Attorney, Agent, or Firm*—Finnegan, Henderson, Farabow, Garrett & Dunner, L.L.P.

[57] ABSTRACT

A fail-safe varistor includes either a fail-short or a fail-open device. Both devices include a fusible, electrically conductive material that melts before the varistor fails due to overvoltage. In the fail-open device, the fusible, electrically conductive material joins separated portions of the leads. The material also may join at least one of the leads directly to a ceramic disk of the varistor. Upon reaching the predetermined temperature, the varistor melts causing a circuit including the varistor to open. In the fail-short device, the material melts creating a short between the leads. This short causes a fuse or a breaker to open the circuit.

11 Claims, 4 Drawing Sheets

OVERLOAD PROTECTED SOLID STATE VARISTORS

BACKGROUND OF THE INVENTION

The present invention relates to a solid state varistor, and, more particularly, to a solid state varistor having a fail-safe feature to protect against destructive failure of the varistor due to overheating.

Solid state varistors are normally comprised of metal oxides. This type of varistor is characterized by a highly non-linear current-voltage relationship governed by I $V^{\alpha}$, where $2 \leqq \alpha \leqq 6$. At relatively low voltage values, the relationship is nearly linear. However, as the voltage value increases, the current increases exponentially. See Lionel M. Levinson & H. R. Philipp, *The Physics of Metal Oxide Varistors*, Journal of Applied Physics, March 1975, 1332–1341, the subject matter of which is incorporated by reference.

A metal oxide varistor operating under sustained AC overvoltage conditions and unlimited current flow shorts out in a few seconds due to excessive heating ($I^2R$ losses). Immediately thereafter, AC follow current may cause the varistor to explode. An explosion opens the circuit terminating the dangerous conditions. This failure mechanism is considered "safe" because it quickly opens the circuit before a fire or personal safety hazards develop.

In another scenario, other circuit elements (loads) may limit the current flowing through the varistor to a few amperes or less. The solid state varistor again overheats to a limit determined by the current flow and the resistance of the varistor. The varistor may even reach red heat. The heat may ignite the organic coating of the varistor causing obnoxious fumes, open flames, and shock hazards. After the organic coating burns completely away, if the lead wires maintain contact with the ceramic disk of the varistor, the varistor will remain in an overheated state and continue to present a hazard. Both Underwriters Laboratories and the Canadian Standards Association have developed safety standards requiring the addition of "fail-safe" provisions to all listed transient voltage surge protectors, especially those employing solid state varistors.

Some manufacturers of surge protectors have devised strategically located "board level" fusible links and thermal cut-off devices for circuits.

SUMMARY OF THE INVENTION

The advantages and purpose of the invention will be set forth in part in the description which follows, and in part will be obvious from the description, or may be learned by practice of the invention. The advantages and purpose of the invention will be realized and attained by the elements and combinations particularly pointed out in the appended claims.

To attain the advantages and in accordance with the purpose of the invention, as embodied and broadly described herein, a solid state varistor of the invention comprises leads connected to the varistor, at least one of the leads has a fusible link. The fusible link melts when heated to a predetermined temperature to produce an open circuit in the lead.

In a second aspect of the invention the advantages and purpose of the invention are attained by a method of manufacturing a solid state varistor having thermal overload protection. The method comprises the steps of connecting leads to a ceramic disk; separating at least one of the leads into separated portions; and forming a fusible link connecting the separated portions, the link being meltable when heated to a predetermined temperature creating an open circuit between the separated portions.

In another aspect of the invention, a fusible link joins at least one of the leads to the varistor. Upon reaching the predetermined temperature, the link melts opening the circuit between the lead and the varistor.

In yet another aspect of the invention, a metal oxide varistor has an opening therethrough; leads are connected to the varistor; and fusible, electrically conductive material is located in or adjacent the opening. The material melts upon reaching a predetermined temperature creating a short circuit between the leads. This short causes a device elsewhere in the circuit to open the circuit.

It is to be understood that both the foregoing general description and the following detailed description are exemplary and explanatory only and are not restrictive of the invention, as claimed.

Additional objects and advantages of the invention will be set forth in part in the description which follows, and in part will be obvious from the description, or may be learned by practice of the invention. The objects and advantages of the invention will be realized and attained by the elements and combinations particularly pointed out in the appended claims.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

In accordance with the invention, the varistor of the present invention includes a ceramic disk, leads, and means for opening a circuit if the temperature of the varistor rises above a predetermined level.

Preferably, the varistor is a metal oxide varistor and said means comprises a mass of fusible, electrically conductive material which melts causing the circuit including the varistor to open.

The invention will be further clarified by the following examples, which are intended to be purely exemplary of the invention.

First, second, and third embodiments of the invention are all directed to varistors having various fail-open devices. These embodiments are illustrated in FIGS. 1–6. A solder mass completes a circuit including leads and a ceramic disk. When there is an overvoltage, the temperature of the varistor rises. This event causes the solder mass to melt, creating an open circuit.

Fourth and fifth embodiments of the invention are directed to varistors having various fail-short devices. These embodiments are illustrated in FIGS. 7 and 8. A solder mass is located on or in the ceramic disk of the varistor between the leads. This mass does not complete a circuit. When there is an overvoltage, the temperature of the varistor rises causing the solder mass to melt and flow, creating a short between the leads. This short causes a separate fuse or breaker elsewhere in the circuit to open the circuit.

Figure 1A:
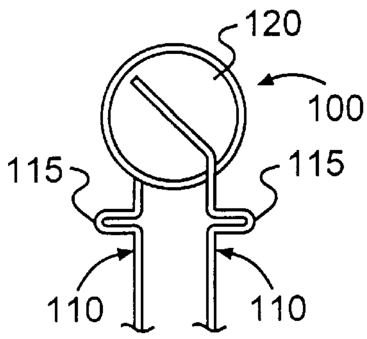
FIGS. 1A, 1B, 1C, and 1D are plan views of the first embodiment of the invention depicting successive manufacturing steps.
Figure 1B:
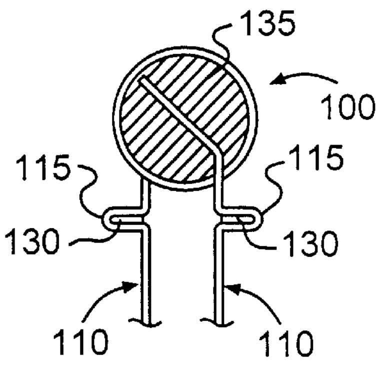
Figure 1C:
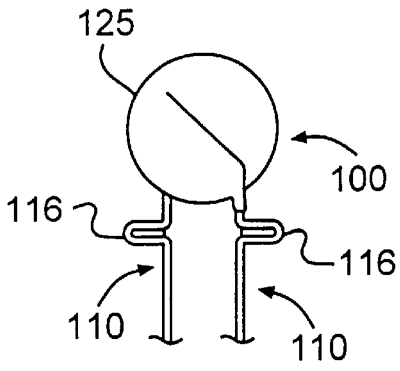
Figure 1D:
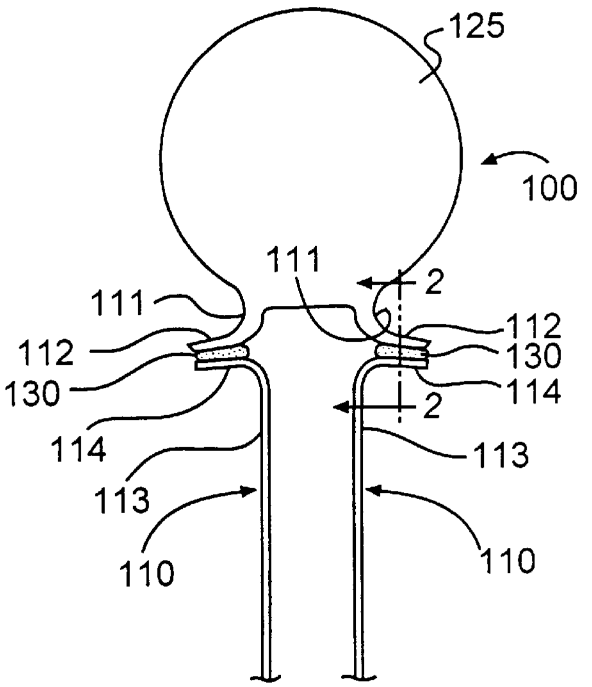
Figure 2:
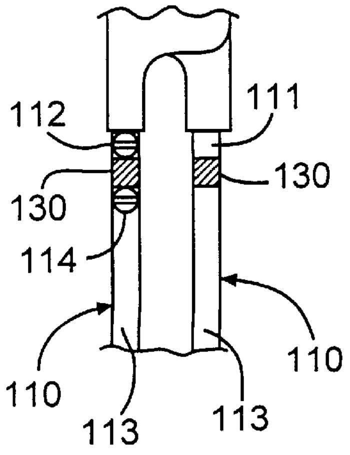
FIG. 2 is a partial section view of a first embodiment of the invention taken along line 2—2 of FIG. 1D.

The first embodiment of a varistor having a lead with a fusible link is illustrated in FIGS. 1 and 2. A varistor 100 includes metallic wire electrical leads 110 attached to each side of a ceramic disk 120. The leads 110 extend distally from the disk. At least one of the leads is separated into proximal and distal portions. The proximal portion includes a proximal straight portion 111 and a proximal bent portion 112 extending outwards (away from the opposite lead) approximately 90 degrees from a distal end of the proximal straight portion. The distal portion includes a distal straight portion 113 and a distal bent portion 114 extending outwards approximately 90 degrees from a proximal end of the distal straight portion. Bent portions 112 and 114 are parallel with one another. A fusible, electrically conductive material 130 joins the bent portions 112 and 114. The fusible, electrically conductive material or solder 130 melts upon reaching a predetermined temperature creating an open circuit. It is understood that one as well as both leads may be formed having the above-described fusible link.

A method of manufacturing a varistor according to the first embodiment of the invention is described hereupon. FIGS. 1A, 1B, 1C, and 1D illustrate intermediate and final products after some method steps have been performed. Kinks 115 are formed along the length of leads 110. The kinks are formed by bending out the leads 110. The fusible, electrically conductive material 130 is introduced within the kinks 115. The material 130 has a wetting affinity for the leads 110, thus allowing application of the material 130 within the kink by a solder-immersion assembly operation. Solder 135 is also applied to the faces of the ceramic disk for attaching the leads 110. After withdrawal from the solder bath and cooling, a fusible solid solder mass remains within the kinks. An epoxy coating 125 is applied such that the meniscus on the leads does not extend into the kink area. In a final step, the ends 116 of the kinks have been removed. It is understood that this method of manufacturing may be applied to one as well as both leads.

Figure 3A:
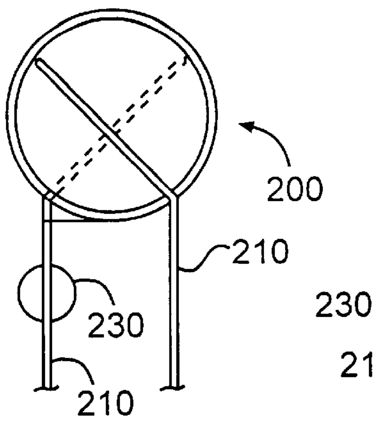
FIGS. 3A, 3B, and 3C are plan views showing the formation of a second embodiment of the invention.
Figure 3B:
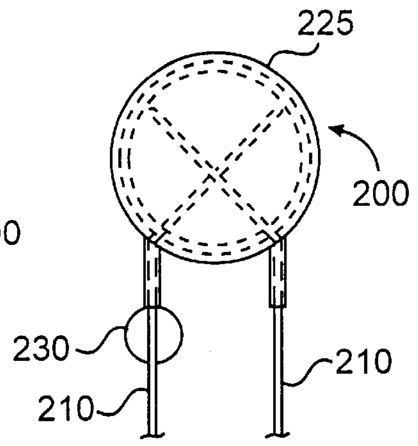
Figure 3C:
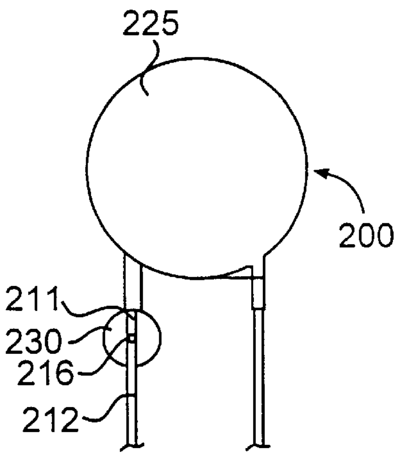

The second embodiment of a varistor 200 having a lead with a fusible link is illustrated in FIGS. 3C. The varistor 200 includes leads 210. At least one of the leads has proximal and distal separated portions 211, 212 separated by a hole fusible, electrically conductive material 230 joins the proximal and distal separated portions 211, 212. As in the first embodiment, the material 230 melts upon reaching a predetermined temperature creating an open circuit.

A method of manufacturing a varistor according to the first embodiment of the invention is described hereupon. FIGS. 3A, 3B, and 3C illustrate intermediate and final products after some method steps have been performed. The fusible, electrically conductive material 230 is formed around a portion of at least one of the leads 210. Epoxy 225 is applied to the varistor. The hole 216 is punched through the portion of the lead surrounded by the material 230.

Figure 4:
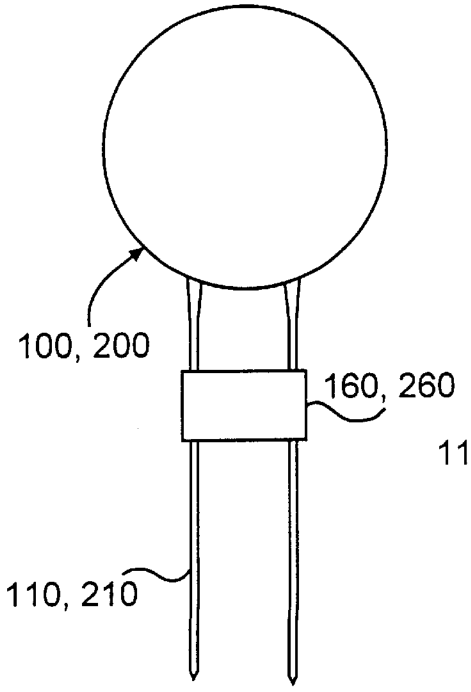
FIG. 4 is a plan view of a fail-safe varistor including a heat sensitive elastic member.
Figure 5:
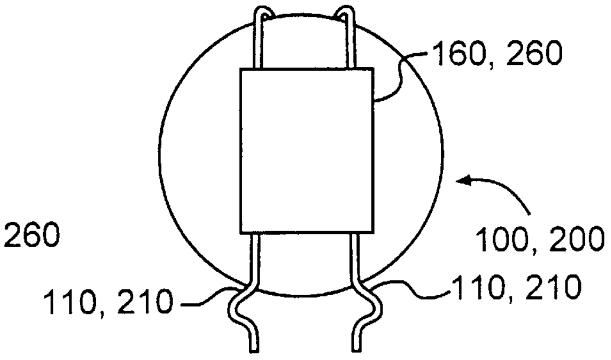
FIG. 5 is a plan view of a fail-safe varistor including a heat sensitive elastic member in contact with the varistor.

A heat sensitive elastic member 160, 260, illustrated in FIGS. 4 and 5, may be used with the varistors of the first and second embodiments of the invention. The member 160,260 comprises a tubing placed over the leads 110, 210. Upon reaching a predetermined temperature, the member contracts significantly and pulls the separated portions away from each other.

As illustrated in FIG. 5, the leads 110, 210 may be bent over such that the member 160, 260 contacts the varistor 100 or 200 providing a greater contact area for thermal transfer. This accelerates the melting of the fusible, electrically conductive material 130, 230 and the contraction of the member 160, 260 producing a more responsive “fail-safe” event.

Figure 6A:
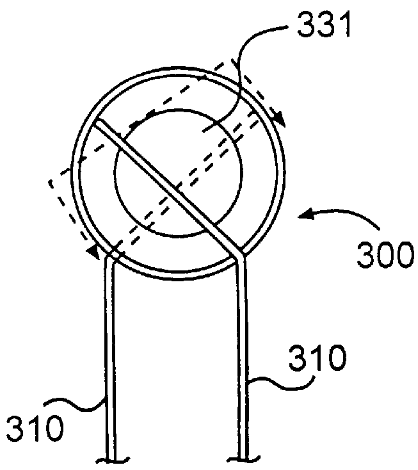
FIGS. 6A and 6B are respective plan and side views of a third embodiment of the invention.
Figure 6B:
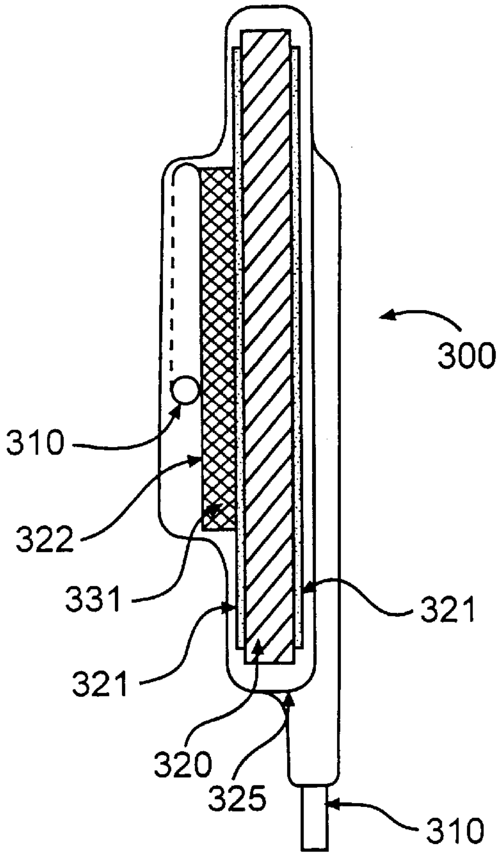

The third embodiment of the invention, as illustrated in FIGS. 6A and 6B, includes a varistor 300 having a fusible, electrically conductive material disk joining at least one of the leads with a ceramic disk of the varistor. Silver electrodes 321 are printed on both sides of the ceramic disk 320 of the varistor 300. A fusible, electrically conductive material disk 331 contacts with at least one of the silver electrodes 321. A silver electrode 322 is printed on the outward surface of the fusible, electrically conductive material disk 331. One of the leads 310 touches the silver electrode 322. The other lead touches the silver electrode 321 on a side of the ceramic disk opposite from disk 331. Upon reaching a predetermined temperature, the disk 331 melts within the epoxy containment 325, creating an open circuit. In another variation, if the molten material expands sufficiently, it may erupt from the epoxy containment and flow out of position between the lead and the ceramic disk again creating an open circuit. It is understood that fusible, electrically conductive material disk may be located on one or both sides of the ceramic disk.

Figure 7A:
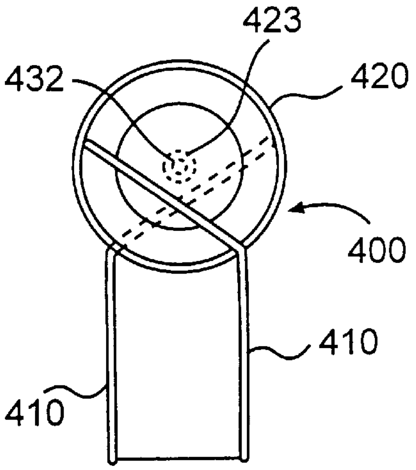
FIGS. 7A and 7B are respective plan and side views of a fourth embodiment of the invention.
Figure 7B:
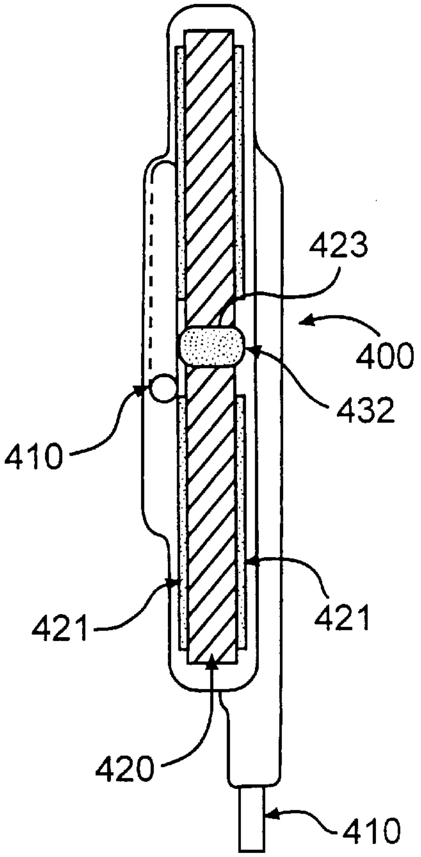

The fourth embodiment of the invention including a varistor 400 with a through hole and a fusible, electrically conductive material pellet in the hole and is illustrated in FIGS. 7A and 7B. Silver electrodes 421 are printed on both sides of the ceramic disk 420 of the varistor 400. The hole 423 extends through the ceramic disk 420 and holds the fusible, electrically conductive material pellet 432. The electrodes are screen printed in a toroidal pattern such that there is a sufficient margin around the perimeter of the hole. This allows the pellet 432 to be inserted without creating a metal-to-metal short. Upon reaching a predetermined temperature, the pellet 432 melts within the hole, creating a short circuit between the leads 410.

Figure 8A:
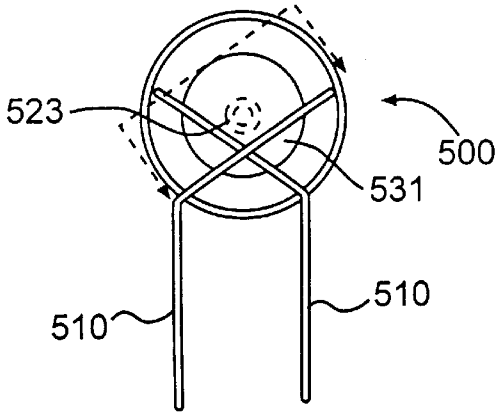
FIGS. 8A is a plan view of a fifth embodiment of the invention before the application of an epoxy coating.
Figure 8B:
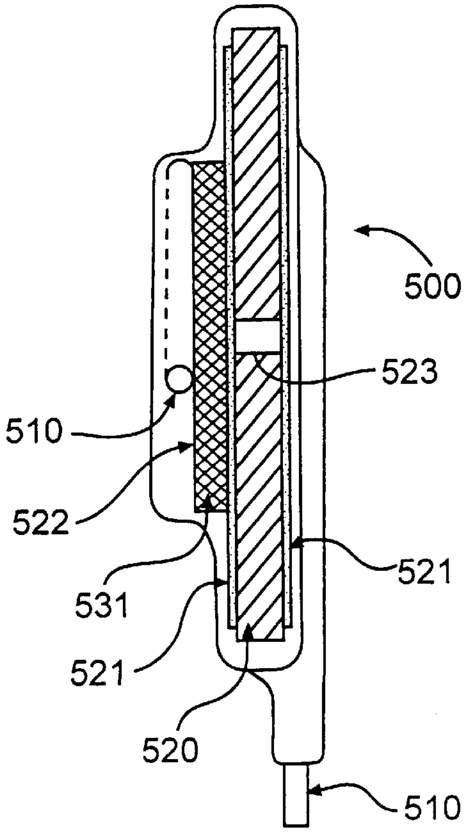
FIG. 8B is a side view of the fifth embodiment of the invention.

The fifth embodiment of the invention including a varistor 500 with a through hole and a fusible, electrically conductive material disk adjacent the hole is illustrated in FIGS. 8A and 8B. Silver electrodes 521 are printed on both sides of the ceramic disk 520 of the varistor 500. The fusible, electrically conductive material disk 531 contacts silver electrode 521 of varistor 500. The hole 523 extends through the ceramic disk 520. A silver electrode 522 is printed on the outward surface of the fusible, electrically conductive material disk 531. One of the leads 510 contacts the silver electrode 522 and the other lead contacts the silver electrode 521 on the opposite side of the ceramic disk 520 from the disk 531. Upon reaching a predetermined temperature, the disk 531 melts.

The molten material flows into the hole 523 creating a short circuit between the leads. A second fusible, electrically conductive material disk also can be located on the opposite side of the ceramic disk 520. It is understood that fusible, electrically conductive material disk may be located on both sides of the ceramic disk.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A solid state varistor having thermal overload protection, comprising:

a metal oxide varistor; and leads connected to the semiconductor device, at least one of the leads having a fusible link between separated portions of the at least one lead, the fusible link being meltable when heated to a predetermined temperature creating an open circuit between the separated portions, and a heat sensitive elastic member formed around the fusible link to further separate the separated portions as the fusible link melts.

2. The solid state varistor as in claim 1, wherein the separated portions are aligned.

3. The solid state varistor as in claim 2, wherein the separated portions are perpendicular to a portion of the at least one lead connecting with the varistor.

4. The solid state varistor of claim 1, wherein the fusible link circumscribes a gap between the separated portions.

5. The solid state varistor as in claim 1, including a heat sensitive elastic member around the fusible link to further separate the separated portions as the fusible link melts.

6. The solid state varistor of claim 5, further comprising the leads being bent over such that the heat shrinkable elastic member contact an outer surface of the varistor.

7. The solid state varistor of claim 5, wherein the heat sensitive elastic member changes shape in response to heat generated by the semiconductor device.

8. The solid state varistor of claim 7, wherein the heat sensitive elastic member comprises a heat shrinkable polymer tube.

9. The solid state varistor of claim 7, wherein the heat sensitive elastic member comprises a shape memory metal alloy.

10. A solid state varistor having thermal overload protection, comprising:

a metal oxide varistor having first and second surfaces;

a first lead electrically connected to the first surface;

a fusible link electrically connected to said second surface; and a second lead electrically connected to said second surface through said fusible link, said fusible link being enclosed in a containment material such that as said fusible link melts within said containment material, an open circuit is formed between said second lead and said second surface.

11. A solid state varistor having thermal overload protection, comprising:

a metal oxide varistor; and leads connected to the metal oxide varistor, at least one of the leads having a proximal portion and a distal portion, the proximal portion having a proximal straight portion and a proximal bend portion, the distal portion having a distal straight portion and a distal bend portion, the proximal bend portion and the distal bend portion being electrically connected by a fusible link, the fusible link being meltable as heated to a predetermined temperature creating an open circuit between the proximal bend portion and the distal bend portion.

* * * * *